US 8,922,007 B2

(12) United States Patent
Kim et al.

(10) Patent No.: US 8,922,007 B2
(45) Date of Patent: Dec. 30, 2014

(54) SEMICONDUCTOR PACKAGE

(71) Applicant: Samsung Electronics Co., Ltd., Suwon-si, Gyeonggi-do (KR)

(72) Inventors: YoungLyong Kim, Gunpo-si (KR); Jaegwon Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/770,936

(22) Filed: Feb. 19, 2013

(65) Prior Publication Data
US 2013/0256877 A1 Oct. 3, 2013

(30) Foreign Application Priority Data

Apr. 2, 2012 (KR) ........................ 10-2012-0034044

(51) Int. Cl.
*H01L 23/48* (2006.01)
*H01L 21/768* (2006.01)
*H01L 23/00* (2006.01)
*H01L 23/498* (2006.01)
*H01L 23/522* (2006.01)
*H01L 23/31* (2006.01)

(52) U.S. Cl.
CPC ... *H01L 23/49827* (2013.01); *H01L 2224/0214* (2013.01); *H01L 2224/16238* (2013.01); *H01L 2224/81424* (2013.01); *H01L 2224/131* (2013.01); *H01L 2224/02125* (2013.01); *H01L 2224/13082* (2013.01); *H01L 2224/81447* (2013.01); *H01L 21/768* (2013.01); *H01L 2224/0401* (2013.01); *H01L 2224/05124* (2013.01); *H01L 23/3192* (2013.01); *H01L 24/05* (2013.01); *H01L 2224/02145* (2013.01); *H01L 2224/13021* (2013.01); *H01L 24/13* (2013.01); *H01L 2224/05147* (2013.01); *H01L 2224/05567* (2013.01); *H01L 2224/05096* (2013.01); *H01L 23/49811* (2013.01); *H01L 2224/13147* (2013.01); *H01L 23/5226* (2013.01)

USPC .......................................... 257/737; 257/774

(58) Field of Classification Search
CPC ....................................................... H01L 23/48
USPC ........................................ 257/758, 737, 774
See application file for complete search history.

(56) References Cited

U.S. PATENT DOCUMENTS

| 5,399,898 | A | * | 3/1995 | Rostoker ....................... 257/499 |
| 6,232,662 | B1 | * | 5/2001 | Saran ........................... 257/750 |
| 7,915,744 | B2 | | 3/2011 | Tu et al. |
| 7,923,295 | B2 | * | 4/2011 | Shim et al. .................... 438/109 |

(Continued)

FOREIGN PATENT DOCUMENTS

| KR | 1020020058590 A | 7/2002 |
| KR | 1020100070633 A | 6/2010 |

*Primary Examiner* — Yu-Hsi D Sun
*Assistant Examiner* — Christina Sylvia
(74) *Attorney, Agent, or Firm* — Renaissance IP Law Group LLP

(57) ABSTRACT

Provided is a semiconductor package including a circuit substrate including a substrate pad, a semiconductor chip spaced apart from and facing the circuit substrate, the semiconductor chip including a chip pad, and a connection pattern electrically connecting the circuit substrate with the semiconductor chip. The semiconductor chip may include a plurality of first circuit patterns extending substantially perpendicular toward a top surface of the semiconductor chip and at least one first via electrically connecting the chip pad to the first circuit patterns. The chip pad may include a first region in contact with the connection pattern and a second region outside the first region, and the first via may be connected to the second region of the chip pad.

19 Claims, 9 Drawing Sheets

(56) References Cited

U.S. PATENT DOCUMENTS

| | | |
|---|---|---|
| 8,115,320 B2 | 2/2012 | Wu |
| 8,138,616 B2 | 3/2012 | Chang et al. |
| 8,319,351 B2 * | 11/2012 | Lee ............................. 257/777 |
| 2006/0244156 A1 | 11/2006 | Cheng et al. |
| 2007/0182001 A1 * | 8/2007 | Kanzaki et al. ............. 257/734 |
| 2007/0200233 A1 | 8/2007 | Chen |
| 2008/0303177 A1 | 12/2008 | Wu et al. |
| 2009/0278251 A1 | 11/2009 | Tsai et al. |
| 2009/0294970 A1 | 12/2009 | Stockinger et al. |
| 2010/0078819 A1 | 4/2010 | Shin et al. |
| 2010/0127408 A1 | 5/2010 | Wang et al. |
| 2010/0155958 A1 | 6/2010 | Kim |
| 2010/0283148 A1 | 11/2010 | Tsai et al. |
| 2011/0049671 A1 | 3/2011 | Yang et al. |

* cited by examiner

SEMICONDUCTOR PACKAGE

CROSS-REFERENCE TO RELATED APPLICATIONS

This U.S. non-provisional patent application claims priority under 35 U.S.C. §119 to Korean Patent Application No. 10-2012-0034044, filed on Apr. 2, 2012, in the Korean Intellectual Property Office, the entire contents of which are hereby incorporated by reference.

BACKGROUND

Example embodiments of the inventive concept relate to a semiconductor package, and in particular, to a flip chip semiconductor package.

Higher integration of semiconductor devices is required to satisfy consumer demands for superior performance and inexpensive prices. Semiconductor packages have been developed to satisfy such consumer demands.

SUMMARY

Example embodiments of the inventive concept provide a semiconductor package with higher reliability and economic feasibility.

According to example embodiments of the inventive concepts, a semiconductor package may include a circuit substrate including a substrate pad, a semiconductor chip spaced apart from and facing the circuit substrate, the semiconductor chip including a chip pad, and a connection pattern electrically connecting the circuit substrate with the semiconductor chip. The semiconductor chip may include a plurality of first circuit patterns extending substantially perpendicular toward a top surface of the semiconductor chip and at least one first via electrically connecting the chip pad to the first circuit patterns, and the chip pad may include a first region in contact with the connection pattern and a second region arranged substantially outside the first region, and the first via may be connected to the second region of the chip pad.

In example embodiments, the first circuit patterns may be spaced apart from and parallel to each other.

In example embodiments, each of the first circuit patterns has a width ranging from about 0.1 μm to about 1 μm.

In example embodiments, the first circuit patterns may be disposed to have spaces therebetween ranging from about 1 μm to about 10 μm.

In example embodiments, the semiconductor chip may further include a second circuit pattern disposed substantially parallel to the top surface of the semiconductor chip, and a second via connected to the second region of the chip pad to electrically connect the second circuit pattern to the chip pad.

In example embodiments, the second via may be provided below the second region of the chip pad.

In example embodiments, the semiconductor chip may further include an insulating structure provided between the first and second circuit patterns and the chip pad, and the insulating structure have a thickness ranging from about 4,000 Å to about 8,000 Å.

In example embodiments, the insulating structure may have a single-layer structure.

In example embodiments, the chip pad may have a thickness of about 6,000 Å or less.

In example embodiments, the package may further include a protection structure exposing the first region of the chip pad and covering the semiconductor chip.

In example embodiments, the protection structure may include a passivation pattern and a photoreactive soluble pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
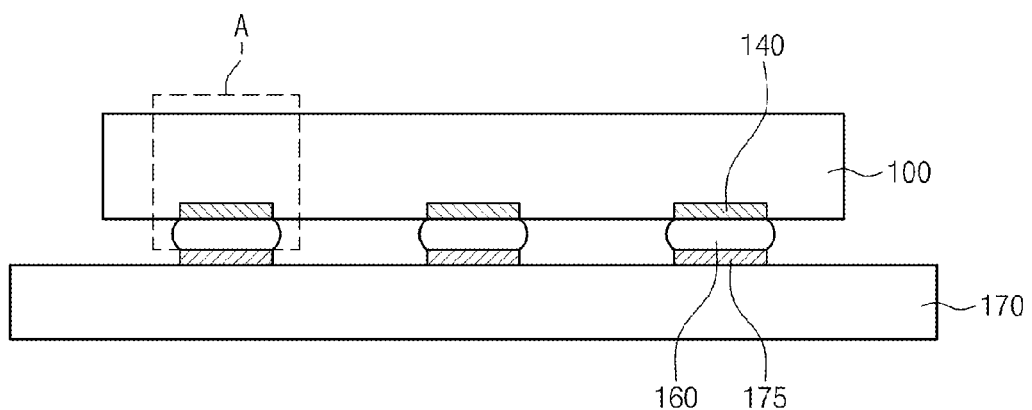
FIGS. 1 through 3 are cross-sectional and plan views illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to -cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
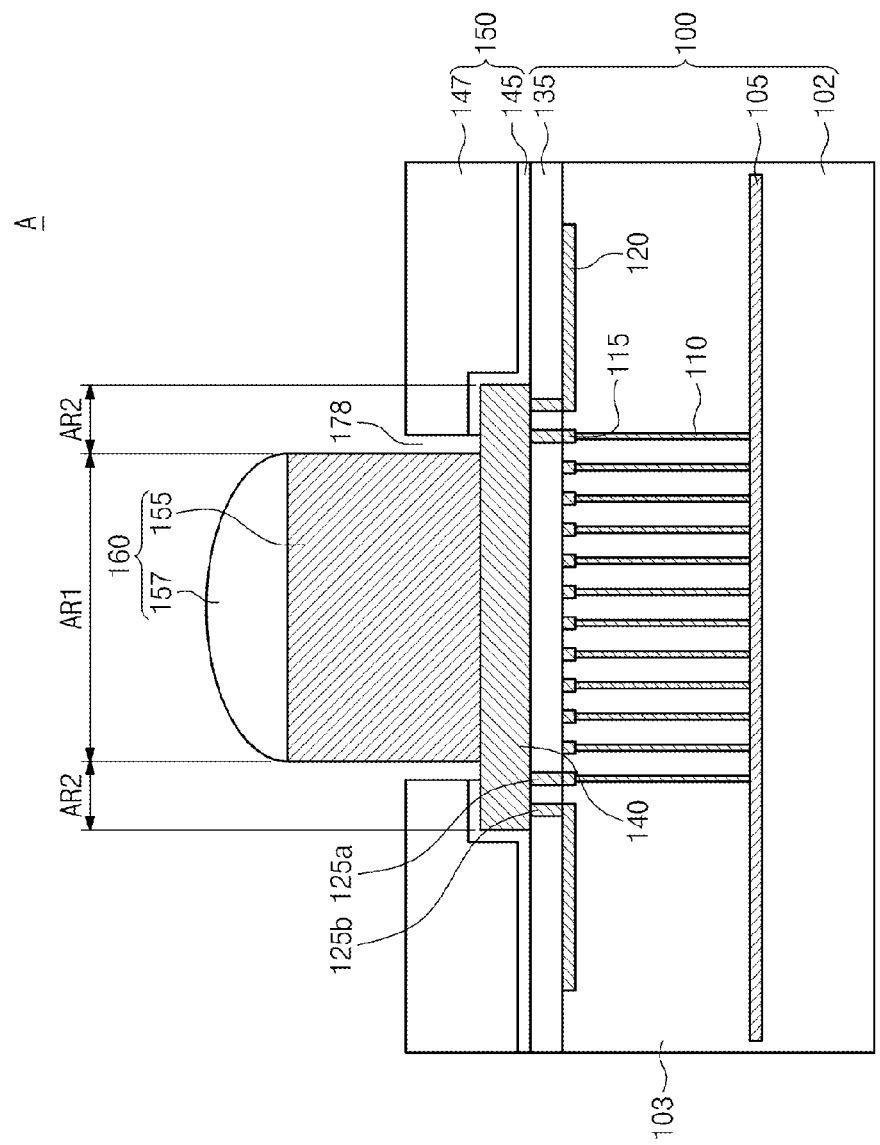
Figure 3:
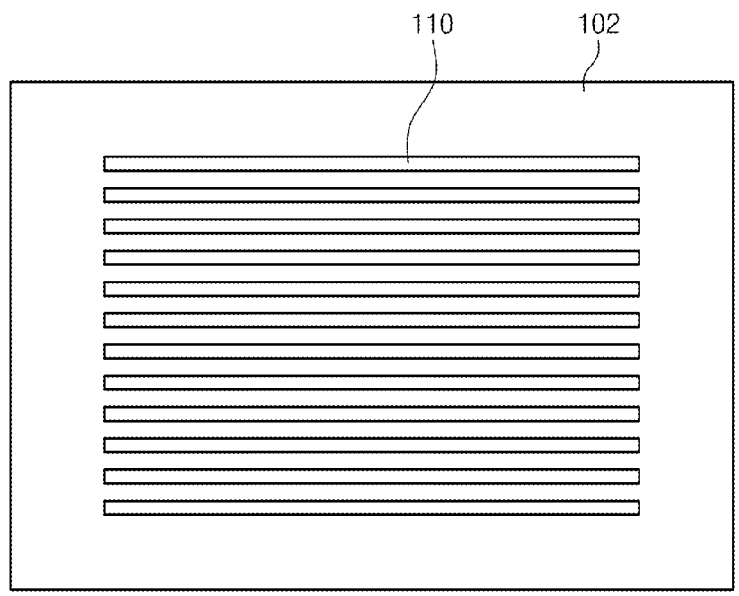
Figure 5A:
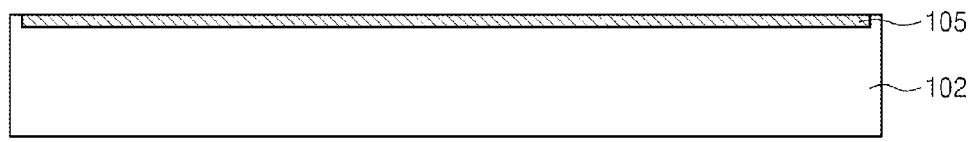
Figure 5B:
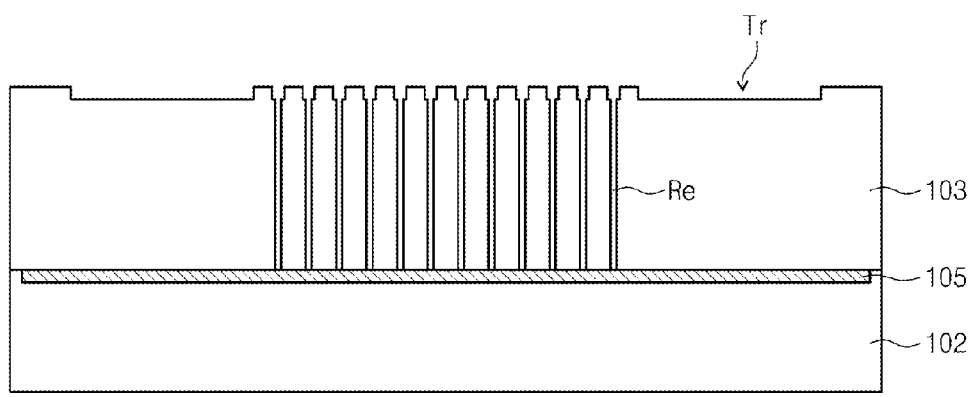
Figure 5C:
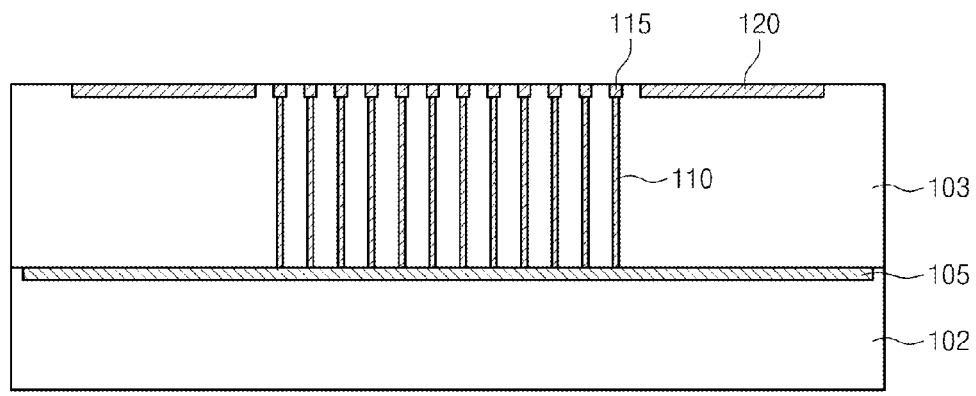
Figure 5D:
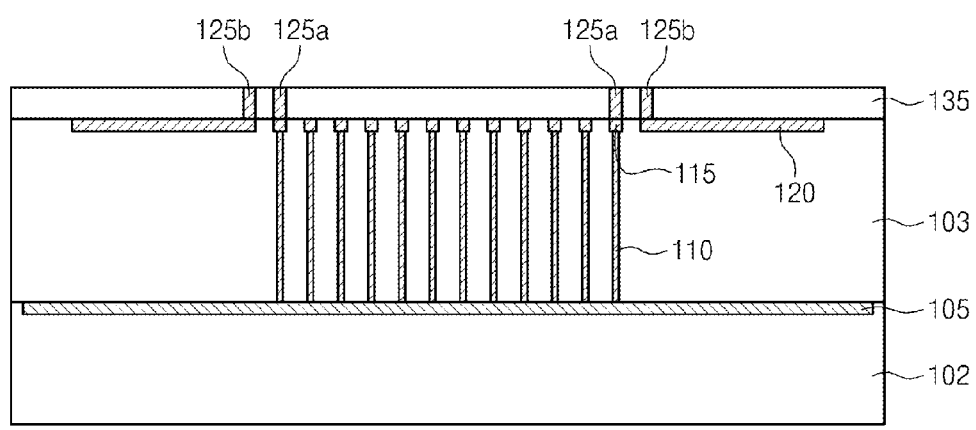
Figure 5E:
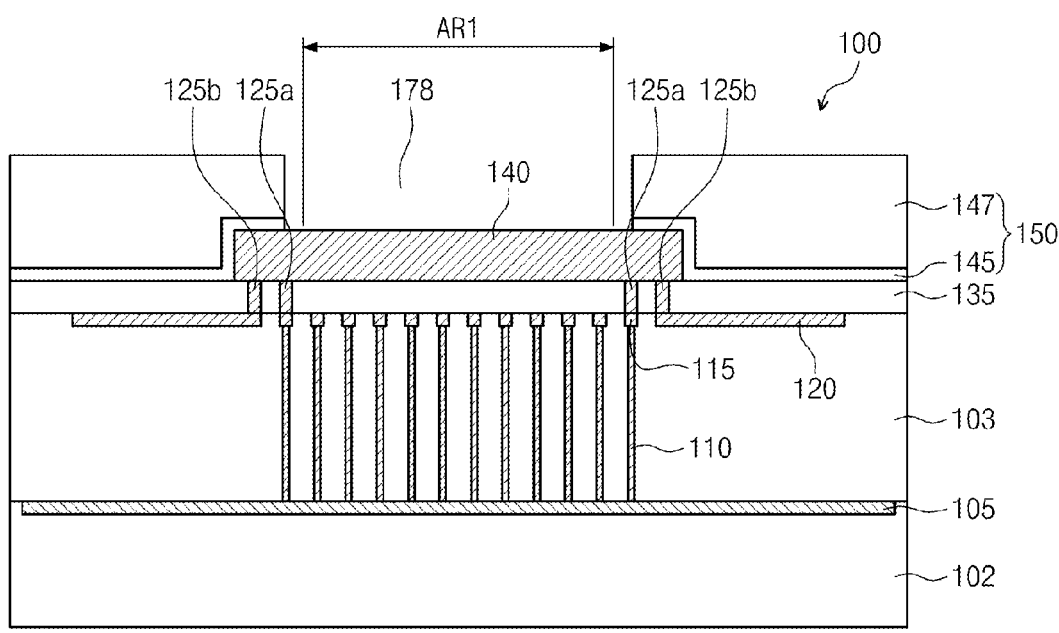
Figure 6:
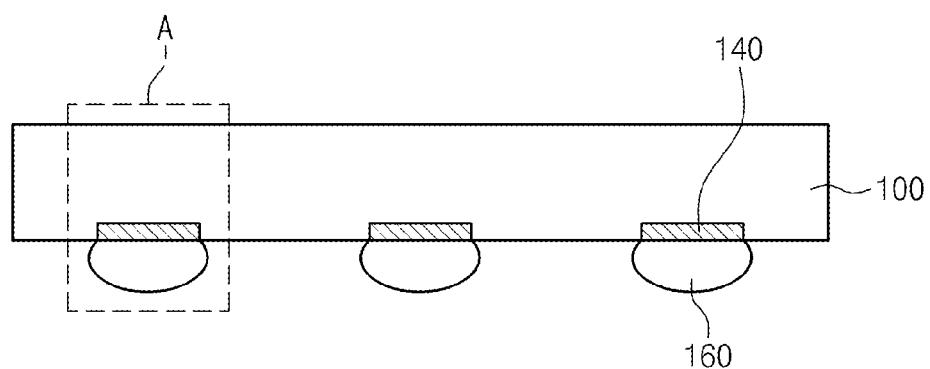

FIGS. 1 through 6 are somewhat schematic illustrations of a semiconductor package according to example embodiments of the inventive concept, showing the semiconductor package having a connection pattern and further illustrating a method of forming the semiconductor package with connection pattern. FIG. 1 is a cross-sectional view illustrating a semiconductor package having a semiconductor chip and substrate according to example embodiments of the inventive concept. FIG. 6 is a cross-sectional view of the semiconductor chip having a connection pattern or conductive bump, and FIG. 2 is an enlarged and inverted cross-sectional view illustrating a portion A of FIG. 6. FIG. 3 is a plan view of the substrate having circuit patterns formed therein, provided to help explain a structure of first circuit patterns of FIG. 1.

Referring to FIGS. 1 and 2, a semiconductor package may include a circuit substrate 170, a semiconductor chip 100, and a connection pattern 160 electrically connecting the circuit substrate 170 with the semiconductor chip 100.

In example embodiments, the circuit substrate 170 may be a printed circuit board (PCB). At least one substrate pad 175 may be provided on a surface of the circuit substrate 170. For example, the number of the substrate pad 175 may be two or more. The substrate pad 175 may be formed of a conductive material, e.g., aluminum (Al) or copper (Cu).

Referring to FIG. 2, the semiconductor chip 100 may include a semiconductor substrate 102, a chip pad 140, first circuit patterns 110, a second circuit patterns 120, first vias 125a, and second vias 125b. FIG. 2 illustrates a structure before the portion A is flip-chip bonded to the substrate pad of the circuit substrate 140 as shown in FIG. 1.

Although not shown in detail, a plurality of memory cells and a plurality of logic cells may be integrated on the semiconductor substrate 102. The memory cells and the logic cells may be electrically separated from each other by at least one insulating material.

The first circuit patterns 110 may overlie the semiconductor substrate 102. The first circuit patterns 110 may be disposed substantially perpendicular to a top surface of the semiconductor substrate 102. In addition, as shown in FIG. 3, the first circuit patterns 110 may be spaced apart from and substantially parallel to each other. In example embodiments, each of the first circuit patterns 110 may have a width ranging from about 0.1 μm to about 1 μm, and a space between the first circuit patterns 110 may range from about 1 μm to about 10 μm. According to one aspect of the inventive concept, the first circuit patterns 110 may be formed to have a minimized pattern width and a maximized space between patterns. In addition, the first circuit patterns 110 may include a conductive material such as metal (e.g., aluminum or copper).

Each of the first circuit patterns 110 may be electrically connected to corresponding ones of the first vias 125a. In example embodiments, the first circuit patterns 110 may be electrically connected to the first vias 125a via connection terminals 115.

The first circuit patterns 110 may be electrically connected to each other by a common pattern 105. For example, as shown in FIG. 2, at least one of the first circuit patterns 110 may have a portion connected to a corresponding one of the connection terminals 115 and other portion connected to the common pattern 105.

The second circuit patterns 120 may be provided substantially parallel to the top surface of the semiconductor substrate 102. The second circuit patterns 120 may be electrically connected to the second vias 125b, respectively.

The first and second vias 125a and 125b may overlie the first and second circuit patterns 110 and 120, respectively. The chip pad 140 may overlie the first and second vias 125a and 125b. The chip pad 140 may include a first region AR1 in contact with the connection pattern 160 and a second region AR2 arranged outside or substantially surrounding the first region AR1. The first vias 125a may extend from the second region AR2 of the chip pad 140 toward the semiconductor substrate 102 through an insulating structure 135. The second vias 125b may be provided adjacent to the first vias 125a and extend from the second region AR2 of the chip pad 140 toward the semiconductor substrate 102 through the insulating structure 135.

The semiconductor package may further include a protection structure 150, which may cover a portion of the second region AR2 of the chip pad 140 and the insulating structure 135. In example embodiments, the protection structure 150 may have an opening 178 therein, through which the whole first region AR1 of the chip pad 140 is exposed. The protection structure 150 may cover at least a portion of the second region AR2. The protection structure 150 may include a passivation pattern 145 adjacent to the chip pad 140 and a photoreactive soluble pattern 147 disposed on the passivation pattern 145.

Referring back to FIG. 1, the connection pattern 160 may be provided between the substrate pad 175 and the chip pad 140. For example, the connection pattern 160 may be in contact with the first region AR1 of the chip pad 140 exposed through the opening 178 of the protection structure 150 but may not be in contact with the protection structure 150. In addition, the connection pattern 160 may have a top surface higher than the protection structure 150. For example, the connection pattern 160 may include a multi-layer structure including a copper pattern 155 and a solder ball (or conductive bump or post) 157. Alternatively, the connection pattern 160 may be a solder ball or conductive bump (or post). According to example embodiments of the inventive concept, since the first circuit patterns 110 have a vertical structure, the first circuit patterns 110 can support the connection pattern 160 during a process of connecting the circuit substrate 170 to the semiconductor chip 100. In addition, since the first circuit patterns 110 have the vertical structure in the semiconductor chip 100, the semiconductor chip 100 can have a reduced size.

Figure 4:
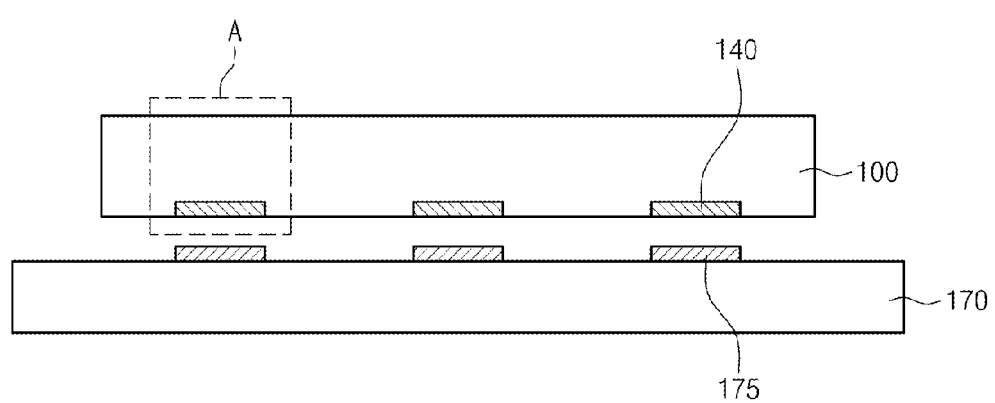
FIGS. 4 through 6 are cross-sectional views illustrating a method of fabricating a semiconductor device according to example embodiments of the inventive concept.

FIGS. 4 through 6 are cross-sectional views illustrating a method of fabricating a semiconductor device according to some example embodiments of the inventive concept.

Referring to FIG. 4, the circuit substrate 170 and the semiconductor chip 100 may be provided.

The circuit substrate 170 may include at least one substrate pad 175. For example, a plurality of the substrate pads 175 may be formed on the circuit substrate 170.

The semiconductor chip 100 may include the first circuit patterns 110, the second circuit patterns 120, the first vias 125a, the second vias 125b, and the chip pad 140, which may be formed on the semiconductor substrate 102. Hereinafter, the formation of the semiconductor chip 100 will be described in brief with reference to FIGS. 5A through 5E. FIGS. 5A through 5E shows the method of fabricating the semiconductor chip 100 according to example embodiments of the inventive concept and are inverted cross-sectional views of the portion A of FIG. 4.

Although not shown in detail, the memory cells and the logic cells may both be formed on the semiconductor substrate 102. Referring to FIG. 5A, the common pattern 105 may be formed on the semiconductor substrate 102. The common pattern 105 may be formed of a conductive material such as a metal, e.g., copper or aluminum, and extend substantially parallel to the top surface of the semiconductor substrate 102.

Referring to FIG. 5B, an interlayer insulating layer 103 may be formed to include a plurality of recesses Re exposing portions of the common pattern 105.

Each of the recesses Re may be formed to extend along a longitudinal direction, which may be not parallel to the top surface of the common pattern 105. For example, each of the recesses Re may be formed to extend along the longitudinal direction, which is substantially perpendicular to the top surface of the common pattern 105. In example embodiments, the recesses Re may be formed to have a width ranging from about 0.1 μm to about 1 μm and an interval ranging from about 1 μm to about 10 μm. According to some aspects of the inventive concept, the recesses Re may be formed by a dual damascene process, and thus, each of them may have an upper portion wider than a lower portion, as shown in FIG. 5B.

In example embodiments, during the formation of the recesses Re, the interlayer insulating layer 103 may be etched to form trenches Tr substantially parallel to the top surface of the common pattern 105. The trenches Tr may be formed adjacent to the recesses Re.

Referring to FIG. 5C, the recesses Re may be filled with a conductive material to form the first circuit patterns 110 and the connection terminals 115. In addition, the trenches Tr may be filled with the conductive material, which may be provided to form the first circuit patterns 110 and the connection terminals 115, to form the second circuit patterns 120. The conductive material may be a metal, such as aluminum or copper.

According to example embodiments of the inventive concept, each of the first circuit patterns 110 may be formed to have a width of about 1 μm or less. For example, each of the first circuit patterns 110 may have a width ranging from about 0.1 μm to about 1 μm. In addition, the first circuit patterns 110 may form a structure having a plurality of conductive lines spaced apart from each other, in which the first circuit patterns 110 are spaced apart by an interval or space of about 1 μm or more from each other. In example embodiments, the space between the first circuit patterns 110 may range from about 1 μm to about 10 μm. With this structure, it is possible to maintain a good adhesive strength between the interlayer insulating layer and the first circuit patterns 110. For example, even when the first circuit patterns 110 are formed of a metallic material having a weak adhesive strength with the interlayer insulating layer 103, if the first circuit patterns 110 may be formed to have a width of about 1 μm or less and a space of about 1 μm or more, they can be strongly attached to the interlayer insulating layer 103, due to an anchoring effect.

Referring to FIG. 5D, the insulating structure 135 may be formed on the interlayer insulating layer 103 provided with the first and second circuit patterns 110 and 120 and the connection terminals 115, and the first vias 125a and the second vias 125b may be connected to the first and second circuit patterns 110 and 120, respectively.

In example embodiments, the insulating structure 135 may be formed to have a single-layer structure, which may be formed of, for example, a compound material of silicon nitride and TEOS. The insulating structure 135 may be formed to have a thickness of about 4,000 Å or more. For example, the insulating structure 135 may have a thickness ranging from about 4,000 Å to about 8,000 Å.

According to example embodiments of the inventive concept, the insulating structure 135 may be formed to have the thickness of at least 4,000 Å, and this enables to prevent the first circuit patterns 110 from being damaged by a probe, when the first circuit patterns 110 are electrically tested to evaluate package reliability thereof.

The insulating structure 135 may be etched to form first via holes (not shown) exposing the first circuit patterns 110 and second via holes (not shown) exposing the second circuit patterns 120. The first and second via holes may be filled with a conductive material to form the first and second vias 125a and 125b. In example embodiments, the conductive material may be a metal (e.g., aluminum or copper).

Referring to FIG. 5E, the chip pad 140 may be formed on the insulating structure 135 provided with the first and second vias 125a and 125b. The chip pad 140 may be formed in contact with the first and second vias 125a and 125b. In example embodiments, the chip pad 140 may be formed in such a way that the first and second vias 125a and 125b are positioned at an edge region (hereinafter, referred as to a "second region", AR2) of the chip pad 140. Furthermore, the chip pad 140 may be formed to have a thickness of, for example, about 6000 Å or less.

Next, the protection structure 150 may be formed to protect the chip pad 140 and the semiconductor chip 100. The protection structure 150 may be formed to have an opening 178 therein to expose a central region (hereinafter, referred as to a "first region" AR1) of the chip pad 140. In some aspects of the inventive concept, the protection structure 150 may include the passivation pattern 145 and the photoreactive soluble pattern 147, which may be formed to cover edge portions of the insulating structure 135 and the chip pad 140.

Referring to FIGS. 2 and 6, the connection pattern 160 may be formed on the first region AR1 of the chip pad 140.

In example embodiments, the copper pattern 155 may be formed on the chip pad 140, and then, the solder ball (or conductive bump or post) 157 may be formed on the copper pattern 155, thereby forming the connection pattern 160.

Referring back to FIG. 1, the circuit substrate 170 and the semiconductor chip 100 may be electrically connected to each other by the connection pattern 160.

For example, a horizontal position of the semiconductor chip 100 may be adjusted in such a way that the connection pattern 160 is aligned to the substrate pad 175 of the circuit substrate 170, and then, a vertical position of the semiconductor chip 100 may be adjusted in such a way that the connection pattern 160 is in contact with the substrate pad 175. Thereafter, the semiconductor chip 100 and/or the connection pattern 160 may be pressed and heated to form the connection pattern 160 electrically connecting the substrate pad 175 with the chip pad 140.

Due to the presence of the first circuit patterns 110 provided in the semiconductor chip 100, it is possible to substantially prevent the connection pattern 160 from being damaged during the process of pressing and heating the semiconductor chip 100. Accordingly, the semiconductor package can have increased robustness.

Figure 7:
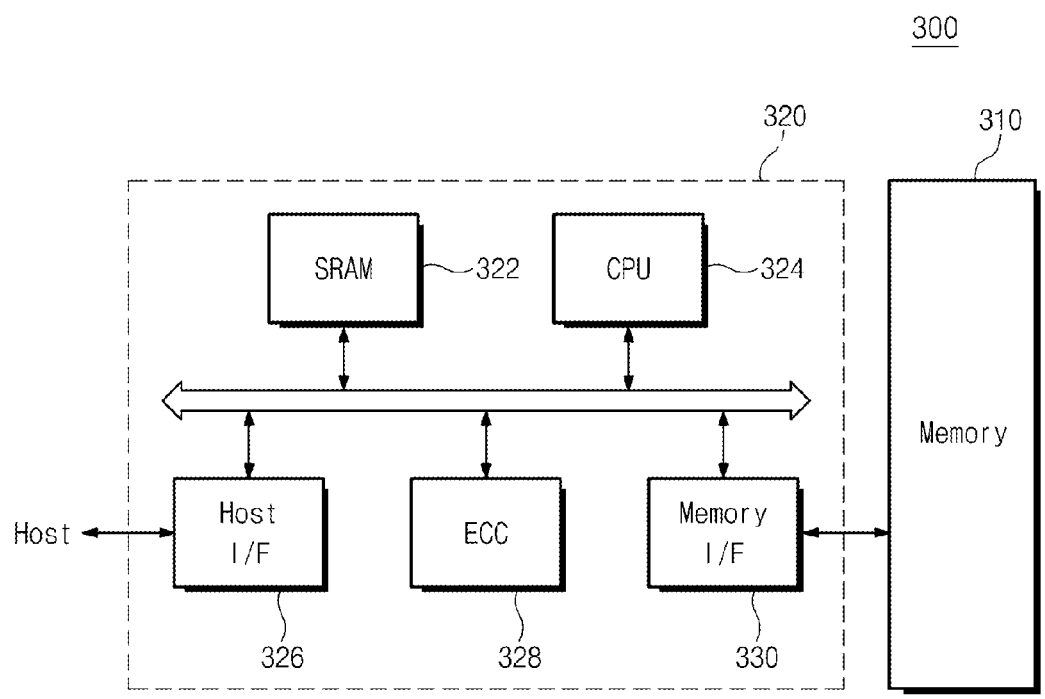
FIG. 7 is a block diagram illustrating a memory card including a semiconductor device according to the example embodiments of the inventive concept.

FIG. 7 is a block diagram illustrating a memory card including a semiconductor package according to the example embodiments of the inventive concept.

Referring to FIG. 7, a semiconductor package according to exemplary embodiments of the inventive concept may be applied to form a memory card 300. The memory card 300 may include a memory controller 320 to control a data exchange between a host and a memory device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the memory device 310. A memory interface 330 can interface with the memory device 310. The central processing unit 324 can control data exchange of the memory controller 320 with, for example, the memory device 310.

The memory device 310 in the memory card 300 may be configured to include the semiconductor package according to the exemplary embodiments of the inventive concept. Accordingly, it is possible to reduce a size of chip or device and make the chip or device robust.

Figure 8:
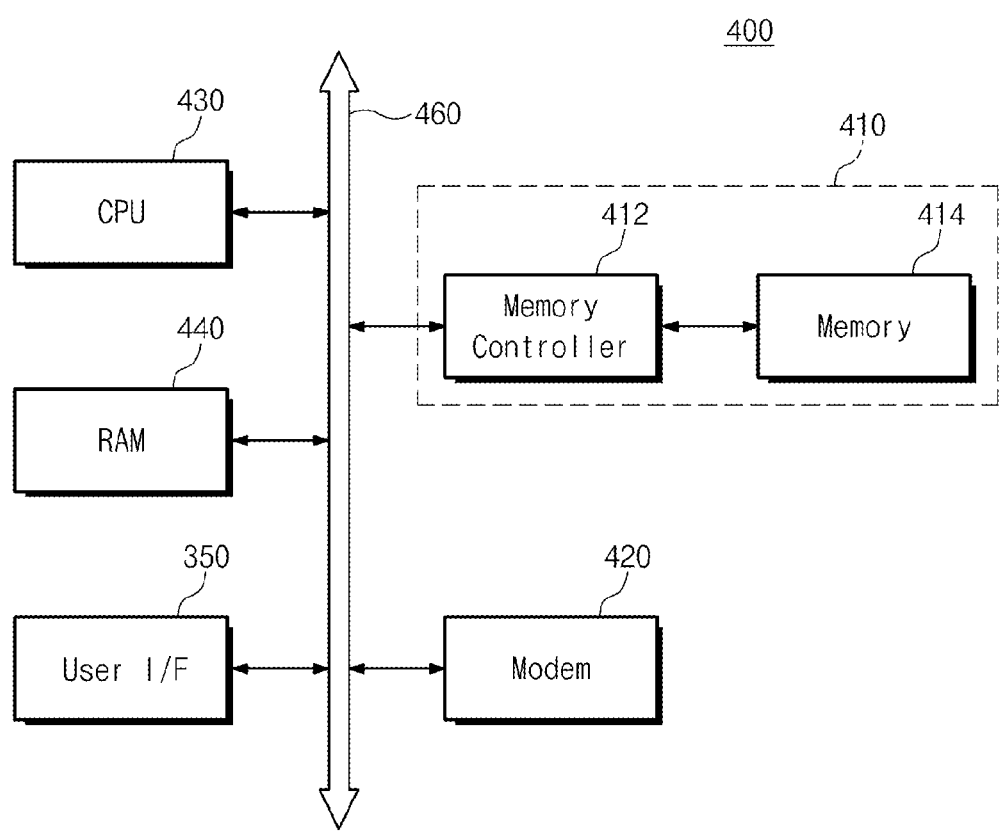
FIG. 8 is a block diagram illustrating an information processing system including a semiconductor device according to the example embodiments of the inventive concept.

FIG. 8 is a block diagram illustrating an information processing system including a semiconductor package according to the example embodiments of the inventive concept.

Referring to FIG. 8, an information processing system 400 may include a semiconductor device according to exemplary embodiments of the inventive concept. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 7. The information processing system 400 may be provided as a memory card, a solid state disk, a camera image sensor and an application chip set. For example, the memory system 410 may be a solid state disk (SSD). The information processing system 400 may stably and reliably store data in the memory system 410.

According to example embodiments of the inventive concept, since the first circuit patterns may include a plurality of vertical patterns arranged to have a line and space structure. Accordingly, the semiconductor package can be highly reliable and durable. In addition, since the first circuit patterns have the vertical structure, occupying a small space, the semiconductor chip can have a reduced size.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a circuit substrate including a substrate pad;
a semiconductor chip spaced apart from and facing the circuit substrate, the semiconductor chip including a chip pad; and
a connection pattern electrically connecting the circuit substrate with the semiconductor chip,
wherein the semiconductor chip comprises a plurality of first circuit patterns extending substantially perpendicular toward a top surface of the semiconductor chip, at least one first via electrically connecting the chip pad to the first circuit patterns, a second circuit pattern disposed parallel to the top surface of the semiconductor chip, and a second via connected to the second region of the chip pad to electrically connect the second circuit pattern to the chip pad, and
wherein each of the first circuit patterns and the second circuit pattern are physically separated from each other, and
wherein the chip pad comprises a first region in contact with the connection pattern and a second region arranged outside the first region, and the first via is connected to the second region of the chip pad.

2. The package of claim 1, wherein the first circuit patterns are spaced apart from and substantially parallel to each other.

3. The package of claim 1, wherein each of the first circuit patterns has a width ranging from about 0.1 μm to about 1 μm.

4. The package of claim 1, wherein the first circuit patterns are disposed to have spaces therebetween ranging from about 1 μm to about 10 μm.

5. The package of claim 1, wherein the semiconductor chip further comprises an insulating structure provided between the first and second circuit patterns and the chip pad, the insulating structure having a thickness ranging from about 4,000 Å to about 8,000 Å.

6. The package of claim 5, wherein the insulating structure has a single-layer structure.

7. The package of claim 1, wherein the chip pad has a thickness of about 6,000 Å or less.

8. The package of claim 1, further comprising a protection structure having an opening for exposing the first region of the chip pad and covering the semiconductor chip.

9. The package of claim 8, wherein the protection structure comprises a passivation pattern and a photoreactive soluble pattern.

10. A device, comprising:
    a semiconductor chip including:
        a semiconductor substrate;
        an interlayer insulating layer overlying the semiconductor substrate;
        a chip pad overlying the interlayer insulating layer;
        a plurality of first circuit patterns extending through the interlayer insulating layer, the plurality of first circuit patterns extending substantially perpendicular toward a top surface of the semiconductor substrate;
        a second circuit pattern disposed parallel to the top surface of the semiconductor chip;
        a first via electrically connecting the chip pad to the first circuit patterns;
        a second via electrically connecting the second circuit pattern to the chip pad; and
        a conductive bump overlying the chip pad,
    wherein the chip pad has a central region in contact with the conductive bump and a peripheral region substantially surrounding the central region, wherein each of the first circuit patterns and the second circuit pattern are physically separated from each other, and wherein the first via is connected to the peripheral region of the chip pad.

11. The device of claim 10, further comprising:
    a circuit substrate including a substrate pad, wherein the conductive bump electrically interconnects the circuit substrate with the semiconductor chip.

12. The device of claim 10, further comprising a connection terminal between the first via and one of the plurality of first circuit patterns.

13. The device of claim 10, further comprising a common pattern formed over the semiconductor substrate, wherein the plurality of first circuit patterns are electrically connected to each other by the common pattern.

14. The device of claim 10, wherein the semiconductor chip has an insulating structure overlying the interlayer insulating layer, the first via extends through the insulating structure.

15. The device of claim 14, further comprising a second circuit pattern disposed over the interlayer insulating layer, the second circuit pattern extending substantially parallel to the top surface of the semiconductor chip; and
    a second via connected to the peripheral region of the chip pad to electrically connect the second circuit pattern to the chip pad through the insulating structure.

16. A semiconductor package, comprising:
    a circuit substrate;
    a semiconductor chip including a chip pad; and
    a connection pattern electrically connecting the circuit substrate with the semiconductor chip,
    wherein the semiconductor chip comprises a plurality of first circuit patterns extending substantially perpendicular toward a top surface of the semiconductor chip, a second circuit pattern disposed parallel to the top surface of the semiconductor chip, and a second via electrically connecting the second circuit pattern to the chip pad, and at least one first via electrically connecting the chip pad to the first circuit patterns,
    wherein each of the first circuit patterns and the second circuit pattern are physically separated from each other, and
    wherein the first via is connected to the chip pad outside of a region arranged directly beneath the connection pattern.

17. A semiconductor package according to claim 16, wherein none of the at least one first via are arranged in the region located directly beneath the connection pattern.

18. The package of claim 1, wherein the first circuit patterns are not directly connected to the second circuit pattern.

19. The package of claim 1, wherein the first via is disposed adjacent to a first end of the chip pad, the package further comprising:
    a second via disposed adjacent to the first via;
    a third via disposed adjacent to a second end of the chip pad opposite to the first end; and
    a fourth via disposed adjacent to the third via,
    wherein the semiconductor chip further comprises a plurality of second circuit patterns, including the second circuit pattern, extending substantially parallel to the top surface of the semiconductor chip,
    wherein the first and third vias electrically connect the chip pad to the first circuit patterns,
    wherein the second and fourth vias electrically connect the chip pad to the second circuit patterns, and
    wherein the first, second, third, and fourth vias are disposed beneath and are connected to the second region of the chip pad.

* * * * *